United States Patent
Nakamura et al.

(10) Patent No.: US 6,833,606 B2
(45) Date of Patent: Dec. 21, 2004

(54) FABRICATION OF A HETEROJUNCTION BIPOLAR TRANSISTOR WITH INTEGRATED MIM CAPACITOR

(75) Inventors: Hiroshi Nakamura, Singapore (SG); Ting Cheong Ang, Singapore (SG); Kian Siong Ang, Singapore (SG); Subrata Halder, Singapore (SG); Geok Ing Ng, Singapore (SG)

(73) Assignee: Denselight Semiconductor PTE LTD, Singapore (SG)

( * ) Notice: Subject to any disclaimer, the term of this patent is extended or adjusted under 35 U.S.C. 154(b) by 0 days.

(21) Appl. No.: 10/289,684

(22) Filed: Nov. 7, 2002

(65) Prior Publication Data

US 2003/0085412 A1 May 8, 2003

(30) Foreign Application Priority Data

Nov. 8, 2001 (GB) ............................................. 0126895

(51) Int. Cl.[7] .................. H01L 27/06; H01L 21/70; H01L 29/70
(52) U.S. Cl. ...................... 257/577; 197/198; 197/571; 197/565; 438/309; 438/329
(58) Field of Search .............................. 257/197–198, 257/565, 571, 577, E27.019, E27.02, E27.021; 438/317, 329, 235, 309

(56) References Cited

U.S. PATENT DOCUMENTS

| | | |
|---|---|---|
| 5,268,315 A | 12/1993 | Prasad et al. |
| 5,422,501 A | 6/1995 | Bayraktaroglu |
| 5,858,850 A | 1/1999 | Gomi |
| 5,953,617 A | 9/1999 | Lee |
| 6,306,212 B1 * | 10/2001 | Santiago et al. ............... 117/92 |

FOREIGN PATENT DOCUMENTS

| | | | |
|---|---|---|---|
| JP | 2001156179 A | 6/2001 | |
| JP | 02001156179 A * | 6/2001 | ....... H01L/21/8222 |
| JP | 2001326284 A | 11/2001 | |

OTHER PUBLICATIONS

Agarwal, B. et al. "A 50 GHz Feedback Amplifer with AlInAs/GaInAs Transferred–Substrate HBT", XP–000855901, IEDM Technical Digest, Dec. 7, 1997, ISBN: 0–7803–4100, pp. 743–746.
"PCT Notification of Transmittal of the International Search Report or the Declaration", European Patent Office, 7pgs.

* cited by examiner

*Primary Examiner*—Nathan J. Flynn
*Assistant Examiner*—Johannes Mondt
(74) *Attorney, Agent, or Firm*—Buckley, Maschoff & Talwalkar LLC

(57) ABSTRACT

In the present invention, a semiconductor device is formed which includes an MIM capacitor located on the upper surface of a heterostructure from which the emitter, base and collector sections of a nearby HBT are defined. In this way the capacitor and HBT share a substantially common structure, with the base and emitter electrodes of the HBT fashioned from the same metal layers as the upper and lower capacitor plates, respectively. Furthermore, as the insulator region of the capacitor is formed prior to definition of the HBT structure, the dielectric material used can be deposited by means of a plasma enhanced process, without damaging the HBT structure.

19 Claims, 4 Drawing Sheets

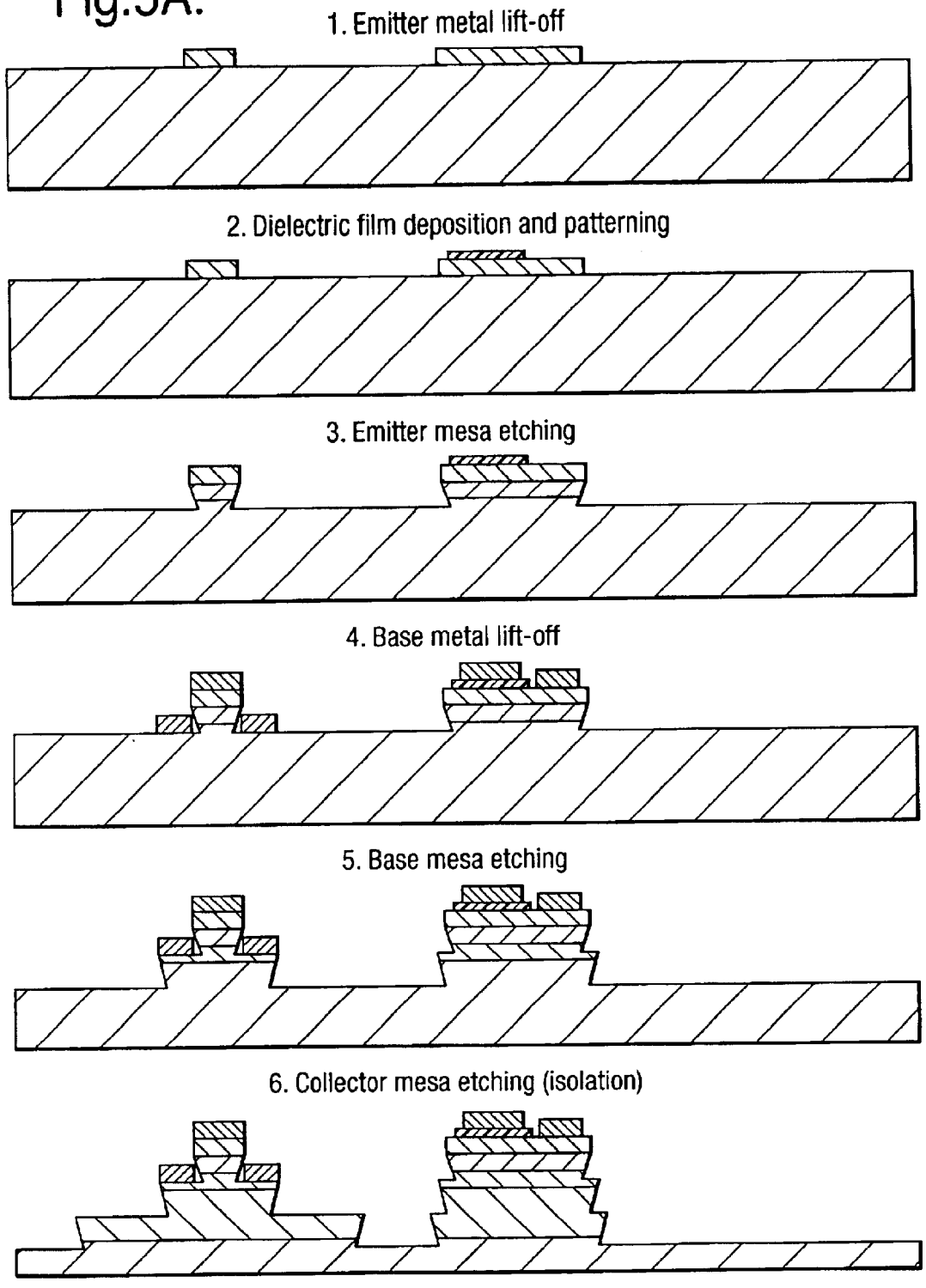

7. Thin film resistor and collector metal lift-off

8. Completion after interconnect

Semi-Insulating InP substrate

- : Emitter Metal
- : Base Metal
- : Collector Metal
- : 2nd Level metal (plating Au)
- : Current film for plating
- : Thin film resistor
- : SiN film

FABRICATION OF A HETEROJUNCTION BIPOLAR TRANSISTOR WITH INTEGRATED MIM CAPACITOR

"This application is a U.S. National filing under 35 U.S.C. §119 hereby claiming priority to GB Application No. 0126895.2, filed Nov. 8, 2001, the contents of which are incorporated herein by reference for all purposes."

1. Field of the Invention

The present invention relates to a process for fabricating a semiconductor device, and more particularly to the fabrication of a heterojunction bipolar transistor with integrated metal-insulator-metal (MIM) capacitor.

2. Background to the Invention

Transistors are commonly used to provide amplifying or switching functions in electronic circuits. The bipolar transistor comprises three regions: an emitter, a collector, and a base located between the emitter and collector. The interfaces, emitter-base and collector-base, between the three regions provide two p-n junctions in close proximity, which are utilized to achieve the bipolar transistor action. The transistor performance demanded by some applications has now reached the operational limit of many conventional designs. A popular approach to overcoming some of these limitations is to include heterojunctions in the heterostructure of the transistor. A heterojunction comprises a junction between two semiconducting materials with different band gaps. Typically, in a transistor comprising heterojunctions, the emitter material has a larger band gap than the base material. The resulting device is termed a heterojunction bipolar transistor (HBT) and has been fabricated using a range of material systems, including silicon-germanium (SiGe), gallium arsenide (GaAs) and indium phosphide (InP).

A typical HBT is a vertically constructed device which consists of a base layer sandwiched between an emitter layer and a collector layer as shown in FIG. 1. Here the heterostructure comprises doped layers of InP and indium gallium arsenide (InGaAs) on an InP semi-insulating substrate. In order to improve the long term reliability of the transistor, a layer of silicon nitride (SiN), silicon dioxide ($SiO_2$), polyimide or benzocyclobutene (BCB) is usually applied to passivate the entire structure, thus protecting the semiconductor layers from direct exposure to environmental elements, such as air or moisture, which could degrade the device performance over time.

The HBT is of particular use in the high frequency (such as multi-GHz) regime, including microwave and millimetre-wave applications. Microwave signals are widely used for high speed communications, including the provision of driving signals for optoelectronic devices. An important building block is the monolithic microwave integrated circuit (MMIC) fabricated on a single chip and commonly comprising active components such as transistors, including the HBT, and passive components such as the metal-insulator-metal (MIM) capacitor and thin film resistor, also fabricated on the same wafer. Indeed, such passive components are often located on the semi-insulating substrate (e.g. GaAs or InP) of the wafer as shown in FIGS. 2 and 3, to avoid current leakage problems. However, the production methods typically used means that the passive components are fabricated subsequently to the HBT, and by a different process. This leads to a more complex production procedure, with many more steps.

The insulator layer used in the fabrication of such MIM capacitors typically comprises a film of a dielectric material with high dielectric constant. Examples include SiN and $SiO_2$, materials that can also be used for HBT surface passivation. The deposition of SiN and $SiO_2$ dielectric films frequently employs plasma-assisted techniques such as plasma enhanced chemical vapour deposition (PECVD). However, the use of a plasma deposition technique is reported to have caused surface damage to an HBT device structure, especially the emitter and base junction area, resulting in degradation of the HBT performance and a potential lack of long-term device reliability. Thus, materials such as polyimide and BCB, which do not use plasma deposition techniques, are preferable for the passivation layer. Unfortunately, these materials are not suitable to be employed as the insulator layer for MIM capacitors, due to their low dielectric constant.

Despite the aforementioned problems, the most common approach used in the production of a complete MMIC is to fabricate first any active devices, such as an HBT, and then subsequently to fabricate the passive components. Using such conventional techniques, the HBT device will unavoidably be exposed to the plasma during the deposition of a dielectric film for the insulator layer of the MIM capacitor, and possibly for the passivation layer of the HBT itself.

A fabrication process has been disclosed in U.S. Pat. No. 5,858,850 for the near simultaneous fabrication of an HBT with integrated capacitor. In this case the HBT is based on a SiGe heterostructure and the capacitor is of the metal-insulator-metal (MIS) type. In the resulting device, either a diffusion layer or the base electrode of the HBT are fabricated from the same material layer as the lower electrode of the MIS capacitor. Similarly, the emitter electrode and upper capacitor electrode are fabricated from common polycrystalline silicon film. Furthermore, to reduce the number of process steps, a layer of SiN is deposited to serve both as the insulator layer for the MIS capacitor, but also as a necessary insulating sidewall for part of the HBT. However, the formation of such a layer by plasma deposition techniques could still lead to degradation of the HBT structure.

SUMMARY OF THE INVENTION

According to the present invention, there is provided a process of fabricating a semiconductor device, including the steps of:

forming a lower plate and an insulator section of a metal-insulator-metal (MIM) capacitor on an upper surface of a heterostructure, the material of the lower plate and underlying heterostructure being common to an electrode and substructure of an emitter section of a heterojunction bipolar transistor (HBT) subsequently defined in the process on another section of the device;

forming a base electrode of the HBT and an upper plate of the MIM capacitor from a commonly deposited metal layer; and, defining base and collector sections of the HBT in layers of the heterostructure located beneath the emitter section.

In the present invention a semiconductor device is formed which includes an MIM capacitor located on the upper surface of a heterostructure from which the emitter, base and collector sections of a nearby HBT are defined. In this way the capacitor and HBT share a substantially common structure, with the base and emitter electrodes of the HBT fashioned from the same metal layers as the upper and lower capacitor plates, respectively. Furthermore, as the insulator region of the capacitor is formed prior to definition of the HBT structure, the dielectric material used can be deposited by means of a plasma enhanced process, without damaging the HBT structure.

Although the HBT-like heterostructure beneath the MIM capacitor is redundant, it is important to isolate it from the HBT itself. Therefore, it is preferred that a section of heterostructure between the location of the HBT and capacitor is etched down to the semi-insulating substrate, so as to provide isolation.

Preferably, the device heterostructure comprises doped layers of epitaxially grown InP/InGaAs materials on a semi-insulating layer of InP.

Preferably, the insulator for the MIM capacitor comprises a dielectric material with a high dielectric constant. More preferably, the insulator for the MIM capacitor comprises a layer of SiN material.

Preferably, any plasma deposition procedures are performed prior to the definition of features in the heterostructure, which may be damaged by exposure to plasma.

Other passive devices, including a thin film resistor, may be defined during the fabrication process. Preferably, metal contacts or electrodes for such devices will be defined from metal layers deposited for the formation of similar structures for the HBT and MIM capacitor. In this way, the number of metal deposition steps during the fabrication process will be minimized.

In order to protect the final device structure, it is preferred that the structure be covered with a passivation layer. However, in order to avoid damaging the device structure, it is preferred that the passivation layer comprises a material of low dielectric constant, which may be deposited without the aid of a plasma process. Preferably the passivation layer comprises a polyimide or BCB material.

Of course, a monolithic microwave integrated circuit (MMIC) may be fabricated in accordance with the present invention, wherein the MMIC comprises a plurality of HBT, MIM capacitor and other devices.

BRIEF DESCRIPTION OF THE DRAWINGS

Examples of the present invention winnow be described in detail with reference to the accompanying drawings, in which.

DETAILED DESCRIPTION

Figure 4:
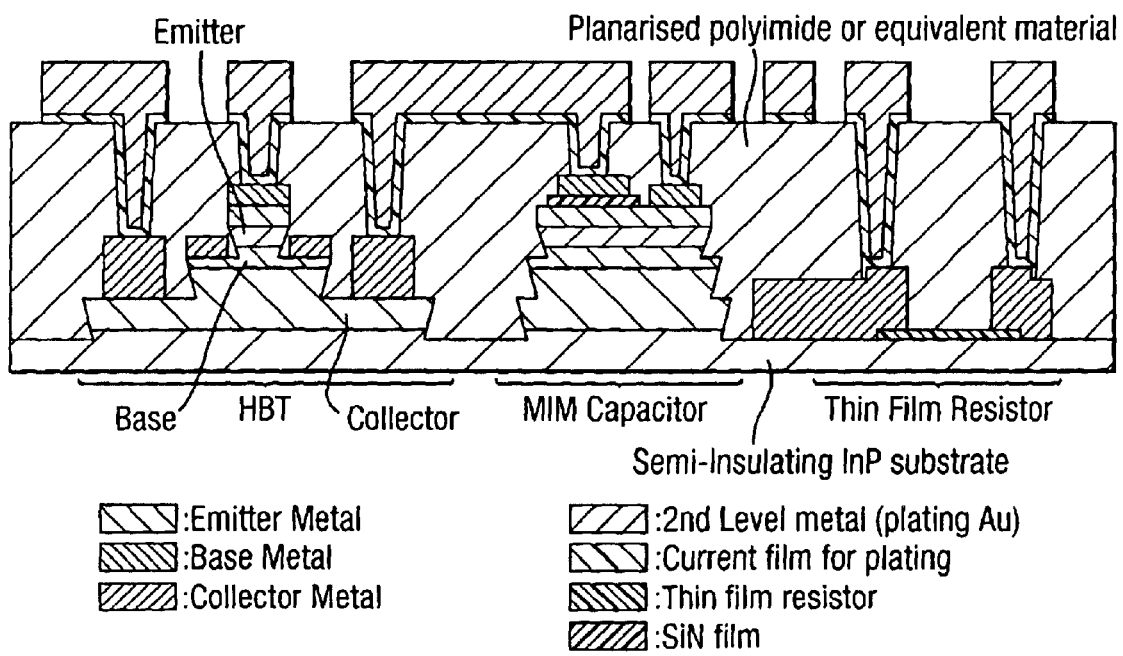
FIG. 4 shows an HBT with integrated MIM capacitor and thin film resistor, fabricated in accordance with the present invention; and, FIGS. 5A and 5B are a series of schematic cross-sectional views showing the process flow for the fabrication of the device in FIG. 4.

To overcome the problems associated with conventional methods of fabricating HBT-based MMICS, we have developed a new process which allows fabrication of an MIM capacitor on top of the layer from which the emitter of the HBT is formed, rather than on the semi-insulating wafer substrate. FIG. 4 shows a schematic cross section of an MMIC, comprising HBT, MIM capacitor and thin film resistor, fabricated in accordance with the present invention. As the MIM capacitor is fabricated on top of the emitter layer, the dielectric film for the insulator section of the MIM capacitor is deposited before commencement of the HBT fabrication. Thus, the base-emitter junction area of the HBT is not exposed during the plasma deposition process, avoiding any associated degradation of the HBT structure. This approach will lead to better HBT performance and reliability, as compared to devices fabricated using more conventional techniques. Furthermore, the proposed process technique results in the near simultaneous fabrication of an HBT with integrated MIM capacitor. The common formation of emitter and base electrodes with lower and upper metal plates of the MIM capacitor, respectively, negates the need for additional metal layers, thereby reducing the number of mask layers and process steps.

Figure 1:
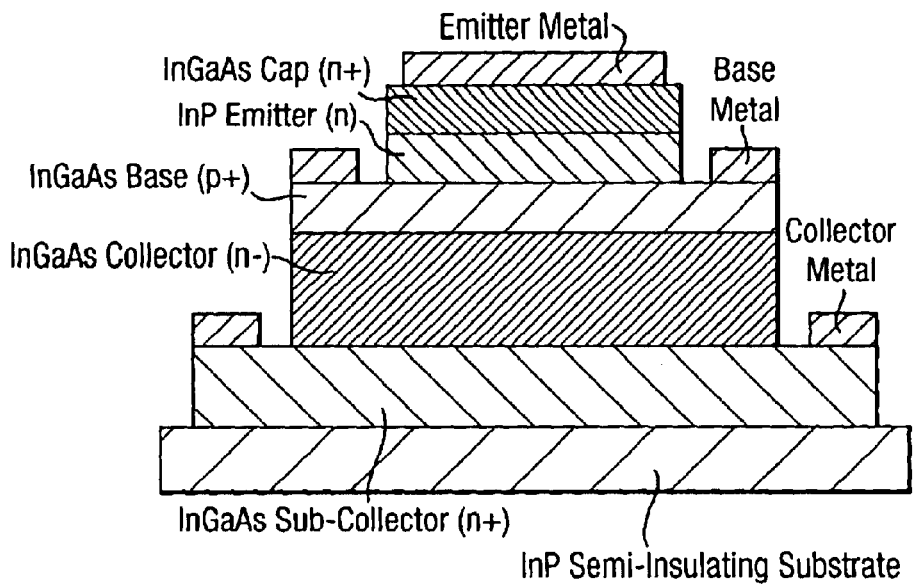
FIG. 1 is a cross-section through the structure of a typical InP/InGaAs based HBT.

We now describe the process, according to the present invention, by which an InP based HBT is fabricated with integrated MIM capacitor, resulting in the device of FIG. 4. The eight main steps involved in the fabrication process are shown schematically in FIGS. 5A and 5B. The semiconductor wafer from which the device is to be fabricated comprises a heterostructure, wherein the epitaxial layers for the collector, base and emitter of an HBT have been successively grown on top of a semi-insulating substrate. Typically the substrate will be InP material and the layers for the HBT will be doped InP/InGaAs, of the type shown in FIG. 1.

As shown in FIG. 5A, in the first process step the metal for the HBT emitter electrode and lower plate of the MIM capacitor is patterned onto the semiconductor wafer by a lift-off process (step 1). Next, a SiN dielectric film is deposited over the top surface of the sample and patterned so as to provide the insulator film for the capacitor (step 2). The SiN layer can be realized using a PECVD process. Subsequently, a mesa that defines the emitter region is etched, using the electrode from the first deposited metal layer as a mask (step 3). At the same time, a mesa structure is etched beneath the lower plate of the capacitor region. It is noted here that the SiN layer is deposited prior to the emitter mesa etching, and therefore the plasma deposition and etching process associated with the dielectric film will have no detrimental effect on the HBT structure and subsequent performance.

Step 4 consists of photoresist patterning and evaporation of a metal layer to define the base electrode. During this step, metal is also deposited on the SiN layer and on the exposed metal of the lower capacitor plate. These two structures serve as the upper plate of the MIM capacitor and a contact electrode for the lower plate of the MIM capacitor, respectively. Next, a base mesa etching is performed, using the exposed metal layers of both the emitter and base as the etching mask (step 5). This is followed by patterning and then etching of a mesa to define the collector region (step 6). This etching step also serves to isolate the HBT transistor and the MIM capacitor, by virtue of the semi-insulating substrate.

Figure 5B:
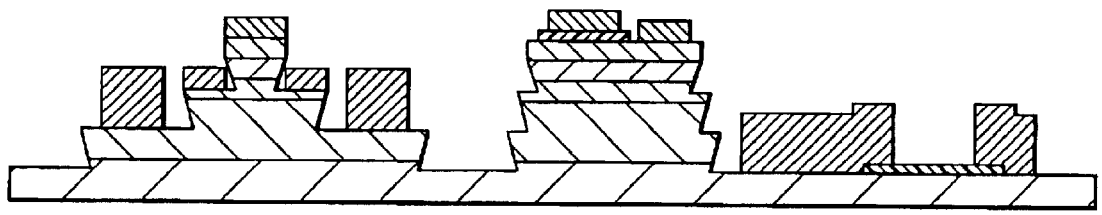
Figure 5B:
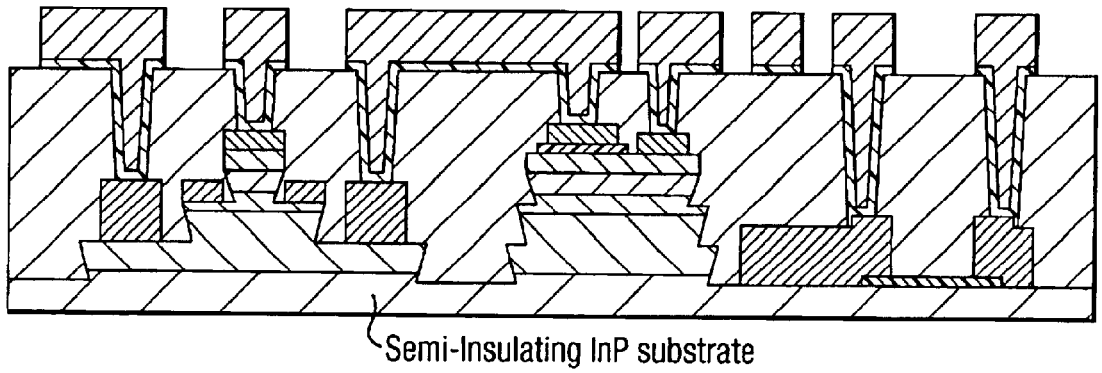

In step 7, shown in FIG. 5B, the thin film resistor is deposited on the required region of the semi-insulating substrate, followed by the deposition and patterning of a metal layer which provides the collector electrode and also the metal contacts for the thin film resistor. The entire wafer is then planarized using a low dielectric constant material such as polyimide or BCB, the resulting coating also serving as a passivation layer for the HBT and other passive components. A low dielectric constant material is chosen here, as the deposition can be achieved without the need for a plasma process and the attendant risk of damage to the device structure. Finally, as shown in step 8 of FIG. 5B, the interconnecting metal tracks are formed on the planarized layer to complete the integrated circuit.

Figure 2:
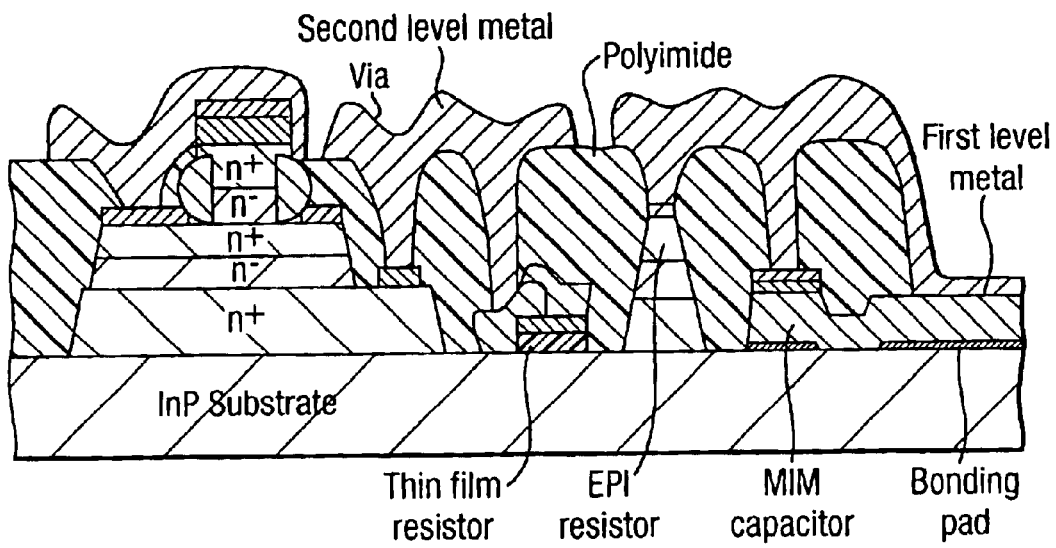
FIG. 2 shows a first example of an HBT with integrated MIM capacitor and thin film resistor.
Figure 3:
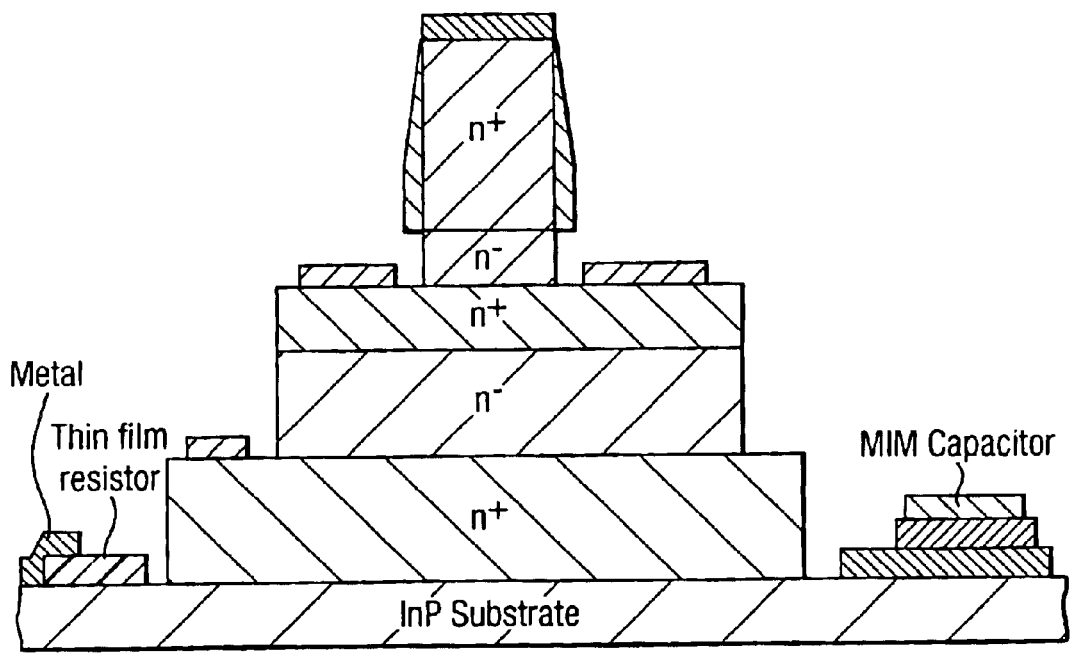
FIG. 3 shows a second example of an HBT with integrated MIM capacitor and thin film resistor.

As has been described, our unique process allows fabrication of an integrated circuit in which a MIM capacitor is located directly on top of a structure closely resembling that of the HBT device (emitter:base:collector), and yet where the capacitor maintains electrical isolation from active devices such as the HBT. This is very different from devices fabricated using conventional techniques, whereby the MIM capacitor is located on the semi-insulating substrate, as shown in FIGS. 2 and 3. In the device shown in FIG. 4, and fabricated according to the present invention, the conductive semiconductor layers beneath the MIM capacitor are covered by the lower metal plate of the capacitor. Thus, the presence of these layers should not affect capacitor performance even at high operating frequency. The present invention allows the near simultaneous fabrication of the components of a MMIC, with a minimum number of process steps, and uses a combination of high and low dielectric constant materials to realize a high performance capacitor and device passivation, without exposing any delicate structures to potentially damaging deposition procedures.

What is claimed is:

1. A semiconductor device comprising:
   a heterojunction bipolar transistor (HBT); and,
   a metal-insulator-metal (MIM) capacitor,
   wherein a lower plate and an insulator section of the MIM capacitor are located on an upper surface of a heterostructure located on a semi-insulating substrate, the material of the lower plate and underlying heterostructure are common to an electrode and substructure of an emitter section of the HBT, which is located on another section of the device, a base electrode of the HBT and an upper plate of the MIM capacitor are formed from a commonly deposited metal layer, and a base section and collector section of the HBT are defined in layers of the heterostructure located beneath the emitter section.

2. A semiconductor device according to claim 1, in which a portion of the heterostructure between the location of the HBT and the location of the capacitor has been etched down to the semi-insulating substrate.

3. A semiconductor device according to claim 1, in which a section of the HBT is electrically connected to a plate of the capacitor.

4. A semiconductor device according to claim 1, further comprising a resistor, a contact for the resistor being formed from a commonly deposited metal layer from which a section of the HBT or MIM capacitor is formed.

5. A semiconductor device according to claim 1, in which the heterostructure comprises layers of epitaxially grown InP/InGaAs materials.

6. A semiconductor device according to claim 1, in which the semi-insulating substrate comprises a layer of InP.

7. A semiconductor device according to claim 1, further comprising a passivation layer located above at least a portion of the device structure.

8. A semiconductor device comprising a plurality of heterojunction bipolar transistors and a plurality of MIM capacitors according to claim 1.

9. A method of fabricating a semiconductor device, comprising the steps of:
   forming a lower plate and an insulator section of a metal-insulator-metal (MIM) capacitor on an upper surface of a heterostructure located on a semi-insulating substrate, the material of the lower plate and underlying heterostructure being common to an electrode and substructure of an emitter section of a heterojunction bipolar transistor (HBT) subsequently defined in the process on another section of the device;
   forming a base electrode of the HBT and an upper plate of the MIM capacitor from a commonly deposited metal layer; and,
   defining base and collector sections of the HBT in layers of the heterostructure located beneath the emitter section.

10. A method according to claim 9, in which the step of forming the insulator section of the MIM capacitor comprises the sub-step of depositing a dielectric material by a plasma-enhanced deposition process.

11. A method according to claim 9, further comprising the step of etching down to the semi-insulating substrate a section of the heterostructure between the location of the HBT and the location of the capacitor.

12. A method according to claim 9, further comprising the step of forming a resisitor on another section of the device, wherein a contact for the resistor is formed from a commonly deposited metal layer from which a section of the HBT or MIM capacitor is formed.

13. A method according to claim 9, further comprising the step of depositing a passivation layer over at least a section of the device by means of a non-plasma-enhanced deposition process.

14. A method for forming a device, comprising:
   forming a tower plate and an insulator section of a metal-insulator-metal (MIM) capacitor on an upper surface of a heterostructure located on a semi-insulating substrate, the material of the lower plate and underlying heterostructure being common to an electrode and substructure of an emitter section of a heterojunction bipolar transistor (HBT) subsequently defined in the process on another section of the device;
   forming a base electrode of the HBT and an upper plate of the MIM capacitor from a commonly deposited metal layer;
   defining base and collector sections of the HBT in layers of the heterostructure located beneath the emitter section; and
   forming a resistor having a contact formed from a commonly deposited metal layer from which a section of at least one of the HBT and the MIM capacitors are formed.

15. The method of claim 14, further comprising:
   etching a section of the heterostructure between the area containing the HBT and the area containing the MIM capacitor, said section etched to the semi-insulating substrate.

16. The method of claim 14, further comprising:
   depositing a passivation layer over at least a section of the device using a non-plasma enhanced deposition process.

17. The method of claim 14, wherein the HBT is electrically connected to a plate of the MIM capacitor.

18. The method of claim 14, wherein the semi-insulating substrate comprises a layer of InP.

19. The method of claim 14, wherein the hetereostructure comprises layers of epitaxially grown InP/InGaAs materials.

* * * * *